United States Patent [19]

Hilker

[11] 4,295,359
[45] Oct. 20, 1981

[54] CALIBRATION APPARATUS FOR CML CIRCUIT TEST UNIT

[75] Inventor: Dennis C. Hilker, Cave Creek, Ariz.

[73] Assignee: Honeywell Information Systems Inc., Phoenix, Ariz.

[21] Appl. No.: 131,294

[22] Filed: Mar. 17, 1980

[51] Int. Cl.³ .......................... G04F 7/00; G01R 31/02
[52] U.S. Cl. ............................................................ 73/5
[58] Field of Search ............. 73/5; 324/158 D, 158 F; 368/9, 113

[56] References Cited

U.S. PATENT DOCUMENTS

| | | | |
|---|---|---|---|
| 3,560,907 | 2/1971 | Heller | 324/158 F |
| 3,648,168 | 3/1972 | Ripplinger | 324/158 D |
| 3,746,973 | 7/1973 | McMahon | 324/158 F |
| 4,002,979 | 1/1977 | Giori et al. | 368/113 |
| 4,068,952 | 1/1978 | Erbert et al. | 73/5 |
| 4,090,141 | 5/1978 | Leblanc | 368/113 |
| 4,128,892 | 12/1978 | Vasa | 368/113 |

*Primary Examiner*—S. Clement Swisher
*Attorney, Agent, or Firm*—William W. Holloway, Jr.; L. J. Marhoefer; N. Prasinos

[57] ABSTRACT

An apparatus for calibrating a test unit adapted to characterize CML integrated circuits. The apparatus is adapted to deskew the time delays of each pin of the fixture which receives the CML circuit under test with respect to a certain predetermined pin and preselected pin thereof. The preselected pin and a predetermined pin are shorted and the time delay between the generation of a shaped pulse and its connection through the preselected pin to the predetermined pin and to a test unit is determined by said test unit. The time delays are then utilized to remove any time delays caused by the test apparatus itself so that the CML circuit under test can be accurately characterized.

8 Claims, 7 Drawing Figures

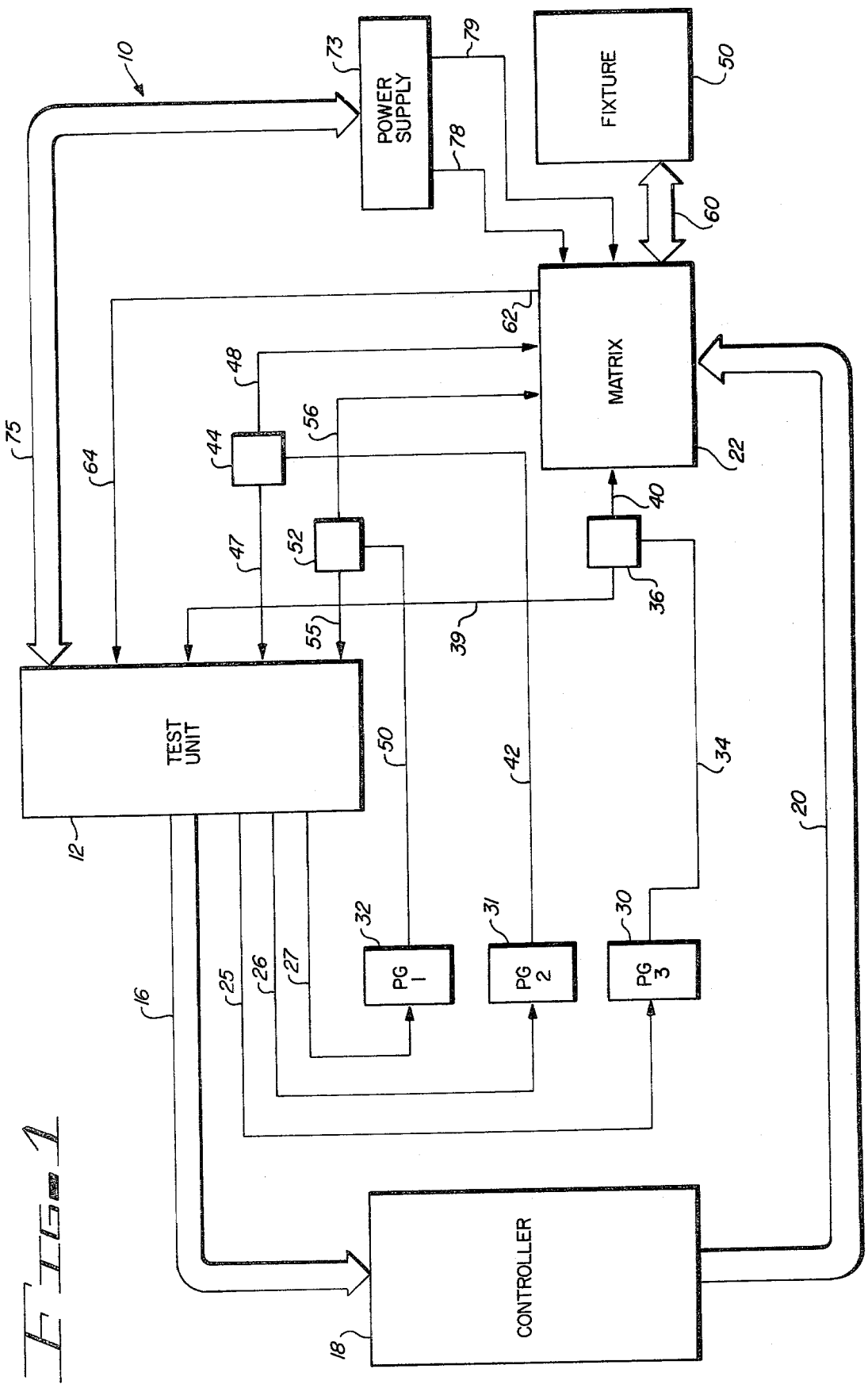

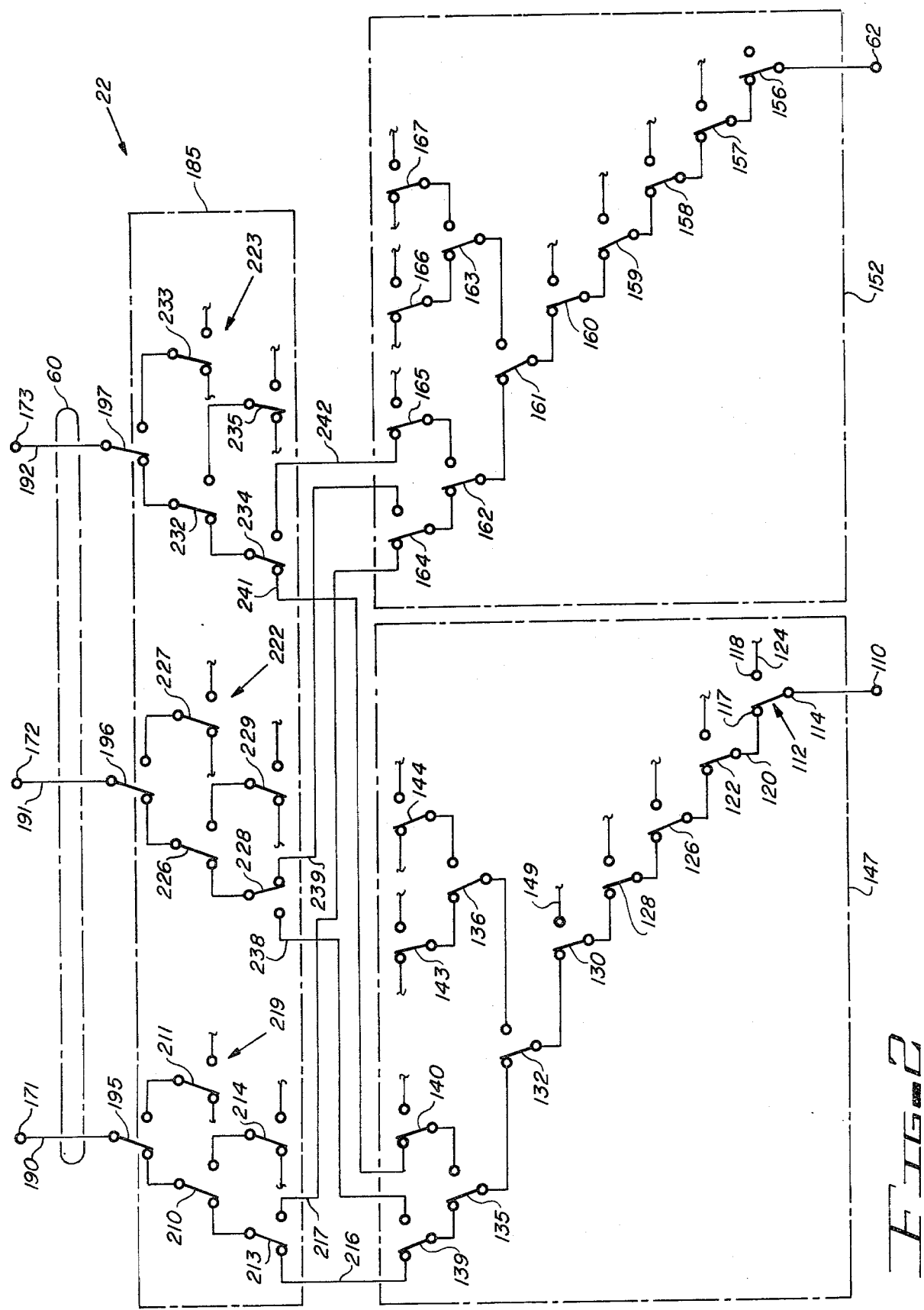

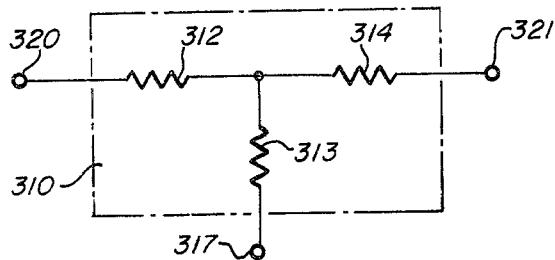
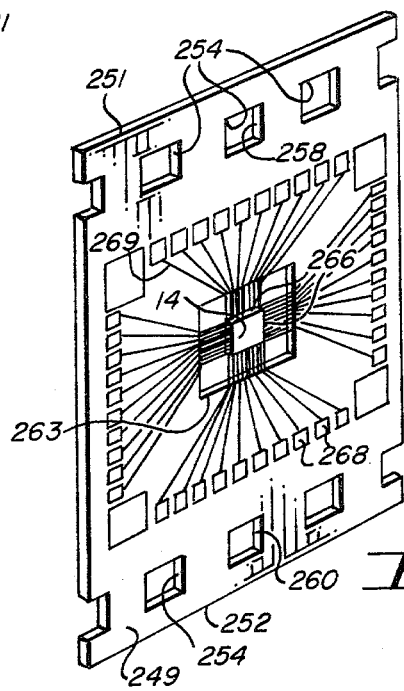
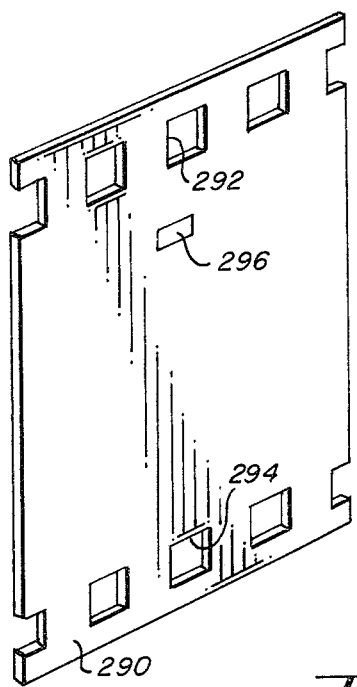
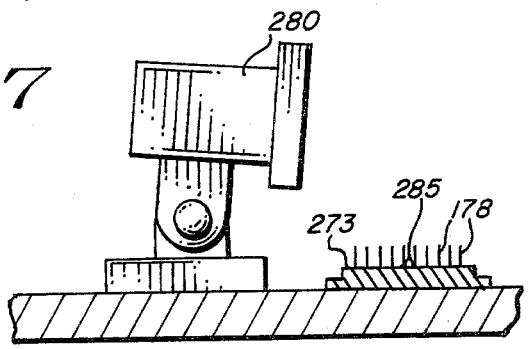
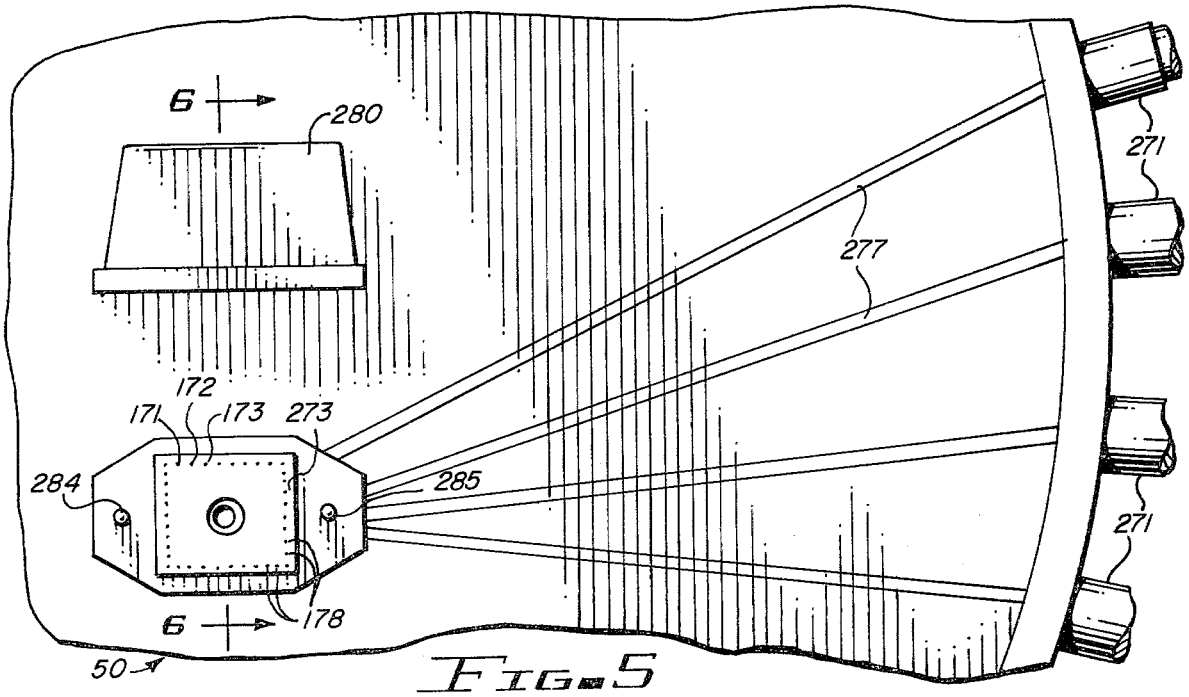

CALIBRATION APPARATUS FOR CML CIRCUIT TEST UNIT

BACKGROUND OF THE INVENTION

1. Field of the Invention

The invention relates generally to the calibration of a test unit utilized for characterizing CML integrated circuits, and more particularly, the invention relates to calibration apparatus for a test unit for characterizing CML integrated circuits which determines the time delays present in the test unit prior to testing the CML circuits.

2. Description of the Prior Art.

It is desirable to fully, accurately characterize the propagation time delays of integrated current mode logic (hereinafter referred to as CML) integrated circuits and integrated circuits generally. Therefore, it is necessary to know any time delays which result from the test apparatus associated with CML circuit. The time delays associated with the test apparatus must be removed from the total time delay in order to accurately determine the time delays associated with the CML integrated circuit itself. Because of the complexity of large scale integrated circuits it is desirable that the calibration apparatus for the test unit be automated and relatively simple in nature.

The basic CML circuit is a constant current source applied to the emitters of two transistors. The base of one transistor is connected to a reference voltage source and the base of the other transistor is connected to the input signal which is designed to actuate the switching circuit. The collectors of both transistors are tied through resistors to ground. The output of the basic CML switching circuit can be considered to be at either or both of the collectors of the two transistors. The voltage on the output of the collector having the reference voltage applied thereto is considered to be the true output and the collector voltage of the other transistor is considered to be the complement. This basic circuit can be utilized to construct the various digital logic devices known in the art. For example, it can be utilized to construct AND gates, OR gates, registers, etc.

In order to properly design digital systems it is necessary that the propagation time delays and the transition times along with the other characteristics of the integrated circuits employed in the design be known to the designer. Therefore, accurate testing of the CML integrated circuits is necessary. Further, it is desirable that any time delays due to the test apparatus itself be accurately known so that these time delays can be removed from the time delays determined while testing the CML circuit to determine the time delays associated with the CML circuit itself. Increased accuracy of the characterization of the CML circuit results in the increased likelihood that the final design utilizing the CML circuits will operate as desired.

The prior constructions of CML testing apparatus do not shown the calibration apparatus for a test apparatus utilizing a power splitter and a relay matrix in conjunction with a shorting device.

SUMMARY OF THE INVENTION

A calibration apparatus for a test unit utilized to characterize CML integrated circuits is shown herein. The test unit is generally capable of determining differences in the pulses and the various waveforms it receives. The differences analyzed by the test unit include time delays. That is, the differences in the arrival of the input pulse or waveform to the CML circuit at the test unit and the arrival of the output pulse or waveform from the CML circuit at the test unit. As utilized herein the inputs to the CML circuit under test are referred to as pulses and the output of the CML circuit or test fixture are referred to as a waveform. The test unit is also capable of determining time delays between the arrival of the input pulse and the occurrence of a reflected wave from an open circuit in the test fixture. Test fixture is an apparatus which is capable of receiving a CML circuit.

The test unit actuates a pulse generator which produces a pulse of known shape. The pulses are applied to a power splitter. The power splitter is capable of providing or transferring the pulse applied at its input to two of its outputs. The power splitter is also capable of transferring a reflected wave at one of its outputs to the other output. One output of the power splitter is connected to the test unit and the other output is connected through a matrix of relays to an appropriate test fixture. The relays are electrically actuated and each relay has a connector movable between two electrical contacts. A controller unit provides the necessary switching signals to control the relays. The relays are interconnected to form a number of submatrices and a pin connection matrix. The pin connection matrix is adapted to connect any of the submatrices to a particular pin of the fixture. The fixture has a plurality of pins each pin is capable of contacting one I/O (Input/Output) pad of the CML circuit under test. Thus the matrix is capable of connecting a preselected pin to the output of the power splitter. The matrix through one of its submatrices can connect a predetermined pin to a waveform output of the matrix. The waveform output is in turn connected to the test unit.

A shorting device is provided which is selectively connectable to the fixture as desired to short the preselected and the predetermined pins of the fixture together. The shorting device provides an approximate zero time delay between the preselected pin and the predetermined pin of the fixture.

The method of testing the CML circuit in characterizing a particular circuit is to apply the shaped pulse to pins of the circuit. The circuit is inserted into the fixture for this purpose. The shaped pulse is also utilized as an input to the test unit. The other input to the test unit for comparison purposes to characterize the CML circuit under test is transferred through the matrix and comprises the output waveform from a pin of the CML circuit under test. The shaped pulses are compared with the output waveform including the delay between the receipt of the shaped pulses and the occurrence of the output waveform to determine the characteristics of the device. In order to accurately determine the characteristics of the device it is necessary to know any time delays present in the apparatus which is utilized to conduct a test. During calibration, the shaped pulse is applied to the matrix in the test unit. The CML circuit is not inserted into the fixture. The shaped pulse is applied through the matrix to each pin of the fixture including the preselected and predetermined pins, which can be any two pins of the fixture. The test unit determines the time delay between the receipt of the shaped pulse and the wave reflected from the open pin of the fixture received through the power splitter. The shorting device is then inserted into the fixture and the preselected pin is now directly connected to the predetermined pin of the fixture. It lhas been found useful to select adjacent pins as the preselected and predetermined pins.

It is an advantage of the present invention to provide a shaped pulse through a power splitter to a test unit and to the pins of a fixture through a matrix.

It is a further advantage of the present invention to provide a shaped pulse through a matrix which is capable of connecting the shaped pulse to any one pin of the fixture.

It is also an advantage of the present invention to provide a shorting device selectively connectable between a preselected pin and a predetermined pin of the fixture.

Another advantage of the present invention is to determine the time delay between the shape pulse as applied to the preselected pin and the waveform from the predetermined pin by the test unit.

Another advantage of the present invention is to compare the delays associated with the reflected wave from each pin except for the preselected pin with the time delay associated with the preselected pin and the predetermined pin to determine the differences of each pin as compared with the preselected pin and the predetermined pin.

BRIEF DESCRIPTION OF THE DRAWINGS

FIG. 1 is a block diagram of an embodiment of the present invention;

FIG. 2 is a schematic drawing of a portion of the relay matrix shown in FIG. 1;

FIG. 3 is an example of the power splitter shown in FIG. 1;

FIG. 4 is a view in perspective of a CML integrated circuit and its package;

FIG. 5 is a top view of a fixture which can be utilized with the present invention;

FIG. 6 is a side view of a portion of the fixture shown in FIG. 5; and

FIG. 7 is a view in perspective of a shorting device utilized with the present invention.

DESCRIPTION OF THE PREFERRED EMBODIMENT

A block diagram of a complete CML testing apparatus 10 is shown in FIG. 1. The apparatus 10 includes a test unit 12 which is both capable of directing the various components of the system as required and of determining the characteristics of CML integrated circuit 14 (FIG. 4). These characteristics include the time delay between the application of a shaped pulse to the CML circuit and its response in the form of producing an output waveform. The test unit 12 is connected through a multiline channel 16 to a controller 18. Test unit 12 through channel 16 provides the controller 18 with the necessary signals to ensure that controller 18 provides the proper switching signals through multiline channel 20 to matrix 22. Matrix 22 is comprised of a plurality of relays and will be discussed in detail in connection with FIG. 2.

A controller 18 is connected to each relay within matrix 22 through channel 20 and provides an individual switching signal to each relay although certain relays are switched simultaneously. The relay responds to its switching signal by moving a connector from one contact to another contact.

Test unit 12 is connected via lines 25 through 27 to pulse generators 30 through 32, respectively. Pulse generators 31 and 32 provide a shaped pulse when actuated by test unit 12 to lines 26 and 27, respectively. The shaped pulse produced by each of pulse generators 31 and 32 is of a known shape, duration, and magnitude. The shape of the pulse produced can also be measured in the system to verify its accuracy. Pulse generators 30 is also actuated by test unit 12 through line 25. The pulse provided by pulse generator 30 is of a generally known shape and magnitude but its pulse is noncritical to the function of the apparatus 10. Although the particular arrangement of three pulse generators has been found useful, the calibration of the test unit requires only one pulse generator, for example, pulse generator 31.

Pulse generator 30 is connected through line 34 to a power splitter 36. Power splitter 36 is connected to test unit 12 and matrix 22 through lines 39 and 40, respectively. Pulse generator 31 is connected through line 42 to a power splitter 44. Power splitter 44 is connected through lines 47 and 48 at its outputs to test unit 12 and matrix 22, respectively. Pulse generator 32 is in turn connected through line 50 to a power splitter 52. The output of power splitter 52 is connected through lines 55 and 56 to test unit 12 and matrix 22, respectively. Thus the pulses generated by pulse generator 32 are received by test unit 12 on line 55 and by matrix 22 on line 56. Matrix 22 is adapted to apply the pulses on lines 40, 48, and 56 to any pin of fixture 58 through multi line channel 60 individually. For example, the pulse present on line 48 from pulse generator 32 is connected to a pin of fixture 50 by matrix 22 by a test unit 12 through controller 18. Any pin of fixture 58 can be connected through matrix 22 to a waveform output 62. Waveform output 62 is connected through line 64 to test unit 12. The pin of fixture 58 which is connected to output 62 is predetermined by test unit 12 through controller 18.

Test unit 12 provides commands to a power supply 73 through multiline channel 75. Test unit 12 can also receive various control and status signals from the power supply 73 through channel 75. Power supply 73 responds to the commands from test unit 12 by varying the voltage it supplies to lines 78 and 79. Various voltage configurations can be applied to the CML circuit under test. For example, power supply 73 can supply approximately −3.3 volts to line 78 and −0.26 volts DC to line 79. Various other voltages it might be necessary to fully test to CML circuit can be supplied by the power supply 73. Each of the different, various voltages will require an additional line to matrix 22 and the matrix would be expanded as required. Lines 78 and 79 are connected through matrix 22 under the command of controller 18 to selected inputs, i.e., the power inputs, of CML circuit 14 (FIG. 4).

A detailed schematic of a portion of matrix 22 is shown in FIG. 2. Although only a portion of matrix 22 is shown, those skilled in the art can readily expand the matrix to its full capability. The matrix 22 provides minimum electronic discontinuity for testing waveform distortion because the matrix has no transmission line stubs. In addition the particular matrix shown in FIG. 2 is exemplary only and other matrices as known in the art can be utilized with the present invention. Terminal 110 of matrix 22 can be, for example, connected to line 56 from power splitter 52. Terminal 110 is connected to a relay 112. Relay 112 is comprised of a connector 114 and contacts 117 and 118. Connector 114 is movable between contacts 217 and 218 when actuated by a switching signal from controller 18 through channel 20. One of the lines comprising channel 20 is connected to each of the relays shown in FIG. 2 including relay 112. All of the relays shown in FIG. 2 are similar in operation and the detailed discussion of relay 112 above shall suffice for all. Contact 117 is connected through line 120 to a another relay 122. Contact 118 is connected through line 124 to another relay (not shown). The relay connected to line 124 would be in turn connected to other relays to form a matrix of the desired size. Relay 112 is connected to another relay 126 which is in turn connected to relay 128. Relay 128 has one of its contacts connected to relay 130. Relays 126, 128 and 130 are connected to other relays (not shown in FIG. 2). Relay 130 is also connected to a relay 132. Relay 132 is connected to relays 135 and 136. Relay 135 is connected to relays 139 and 140, and relay 136 is connected to relays 143 and 144. Relays 112, 122, 126 128, 130, 132, 135, 136, 139, 140, 143, and 144 comprise, along with other relays not shown, a submatrix 147.

In an example of expansion for the matrix as shown, relay 130 would be connected through line 149 to a relay (not shown) corresponding to relay 132, which is in turn connected to relays corresponding to relays 135 and 136. In addition those relays corresponding to relays 135 and 136 would be connected to four relays which correspond to relays 139, 140, 143 and 144. All of the relays, for example, relays 139, 140, 143 and 144 are located within a certain level of the matrix. The first level of submatrix 147 comprises only relay 112. The second level comprises relay 122 and another relay (not shown). The third level would have four relays (only one relay 126 is shown). Other additional levels to those shown can be provided as desired to expand the submatrix or levels can be deleted if it is desired to reduce the size of the submatrix. Another submatrix 152 is also shown in FIG. 5. As many submatrices as desired can be provided in accordance with the requirements of the particular application involved.

Submatrix 152 which can be identical to submatrix 147 comprises as shown relays 156 through 167, which correspond to relays 112, 122, 126, 128, 130, 132, 135, 136, 139, 140, 143 and 144, respectively, of submatrix 147. Waveform output 62 is connected to the connector of relay 156. Other relays (not shown) in submatrix 152 would be provided corresponding to those relays (not shown) in submatrix 147 as discussed above.

Waveform output 62 is connected to relay 156. Other submatrices are connected to one of lines 48, 40, 78 or 79. It should be noted that all of the relays of a certain level within a particular submatrix are switched simultaneously to the same position left or right as shown in FIG. 2.

Only three pins 171 through 173 of the pins 178 (FIG. 5) of fixture 50 are shown in FIG. 2. Each of the pins 178 is connected to a pin connection matrix 185. The pin connection matrix is capable of switching any of the submatrices to any desired pin of the fixture 50 (FIG. 5). Pins 171 through 173 are connected to lines 190 through 192, respectively. Lines 190 through 192 are a portion of the lines which comprise channel 60. The other ends of lines 190 through 192 away from the pins are connected to relays 195 through 197, respectively. Relay 195 has its contacts connected to relays 210 and 211. Relay 210 is connected to relays 213 and 214. Relay 214 can be connected to other submatrices (not shown). Relay 211 can be connected to either of line 78 or 79 or to relays corresponding to relays 213 and 214. The contacts of relay 213 are connected through lines 216 and relay 217 to relay 139 of submatrix 147 and relay 164 of submatrix 152 respectively.

Relays 210, 211, 213, and 214 and other relays (not shown) comprise a nodule 219. Pin connection matrix 185 has a nodule connected to each of pins 178 (FIG. 5), for example, nodules 222 and 223 connected to pins 91 and 92, respectively. All of the nodules are as shown in FIG. 2 similar in nature and the detailed discussion of nodule 219 above shall suffice for all.

Nodule 222 comprises relays 196, 226, 227, 228 and 229 which correspond to relays 195, 210, 211, 213 and 214 of nodule 219. Nodule 223 in turn is comprised of relays 197, 232, 233, 234 and 235 which correspond to relays 195 210, 211, 213 and 214 of nodule 219. It should be noted that as with the levels of the submatrices, each of the relays of a particular level of a nodule are switched simultaneously.

As shown in FIG. 2, pin 171 is connected to terminal 110 through pin connection matrix 185 and submatrix 147. The contacts of relay 228 are connected through lines 238 and 239 to relays 139 and 164, respectively. The contacts of relay 234 are connected through lines 241 and 242 to relays 140 and 165, respectively. As shown in FIG. 2 pin 172 of fixture 50 is connected to the waveform output 62 through pin connection matrix 185 and submatrix 152. The relay selection as discussed above is accomplished by test unit 12 through controller 18. Thus, pin 171 would be the preselected pin for application of the pulse and pin 172 would as shown in FIG. 2 comprise the predetermined pin. As shown in FIG. 5, pins 171 and 172 are adjacent; however, it is unnecessary although desirable to minimize any possible time delays that the pins be adjacent. If adjacent pins are not used it would be necessary to determine the delay per unit length of the shorting device; this would require that two shorting tabs with known length differences be utilized to determine the actual delay.

As shown in FIG. 4, a film strip or carrier 249 is made of a flexible material having a substantially uniform thickness. The side edges 251 and 252 of carrier 249 are substantially parallel. A plurality of socket holes or perforations 254 are formed in two rows which are substantially parallel and are equally spaced along edges 251 and 252. Perforation 258 and perforation 260 comprise the center perforations along side edges 251 and 252, respectively, and are utilized for positioning the CML circuit 14. A window or opening 263 is disposed at the center of carrier 249. The CML circuit 14 is shown disposed approximately in the center of opening 263. Opening 263 can be of any appropriate shape and dimension. A plurality of separate conductors 266 connect the input/output terminals of CML integrated circuit 14.

Each of the separate connectors is connected to one of a plurality of pads 268 through a plurality of strip lines 269. Each pad is electrically isolated from its adjacent pads and all other pads. Thus contact with any particular pad provides an electrical connection to a particular input/outpu terminal of CML circuit 14.

A plurality of connectors 271 as shown in FIG. 5 is provided for connecting the particular coaxial lines which are connected to the relays, for example, relay 196 (FIG. 2), to one of the pogo pins 178 disposed on the fixture 50. The pogo pins 178 which includes pins 171 through 173 are disposed on a raised surface 273. Connectors 271 are attached to the pins 178, with each connector connected to only one of the pins 178, through a plurality of strip lines 277.

As shown in FIG. 6, the fixture 50 is provided with a clamp 280 which is rotatable down and onto pins 178 for holding pads 268 against a corresponding one pin of pins 178. Each pogo pin is spring biased upward from surfaces 273 for maintaining contact with its associated pad when clamp 280 engages the circuit 14 and presses it down onto the pins. The guides 284 and 285 (FIG. 5) are disposed on raised surface 273 and are adapted to engage with perforations 258 and 260 to ensure that each pad contacts one and only one of the pogo pins. Guides 284 and 285 should be of a sufficient dimension and rigidity to ensure that the pads 278 are properly positioned over the pins 178 when the circuit 14 is mounted on fixture 50 with one pad contacting only one pin. Only a portion of fixture 50 is shown in FIG. 6. Further, some of the strip lines have been omitted. The lines from the relays which are connected to connectors 271 and the strip lines 277 on fixture 50 comprises the channel 60 (FIG. 2).

Another carrier 290 is shown in FIG. 7. The carrier has perforations 292 and 294 which are located to perform function of engaging guides 284 and 285 in the same manner as perforations 258 and 260. A single pad 296 is shown disposed on carrier 290. Pad 296 is capable of contacting two pins simultaneously when carrier 290 is received onto fixture 50. When clamp 280 is rotated it engages the pad 296 with pins 271 and 272. The pad 296 and carrier 290 comprise a shorting device 298. Pad 296 connects the two adjacent pogo pins, for example, 171 and 172 (FIG. 5) to provide essentially zero time delay between the adjacent pins. The shorting device 298 is therefore selectively connectable between the preselected pin 171 and the predetermined pin 172.

An example of a power splitter 310 which is adapted to be utilized with the present invention is shown in FIG. 3. The structure of power splitter 310 can be utilized as any of power splitters 36, 44, or 52 (FIG. 1). Power splitter 310 is provided with three resistors 312 through 314 which are arranged in a "Y" network. In other words the three resistors are connected at one end to a common terminal and their other opposite ends connected to an input terminal 317 and output terminals 320 and 321. Resistor 312 is connected to terminal 320, resistor 314 is connected to terminal 321, and resistor 313 is connected to terminal 317. The value of the resistors can be, for example, 16.7 ohms. Any pulse or waveform applied to any of the terminals 317, 320 and 321 is transferred to the remaining two terminals.

In operation, the test unit 12 actuates, for example, pulse generator 32. A CML circuit is not inserted into the fixture 50 during the calibration operation. The pulse produced by pulse generator 32 becomes an output of power splitter 52 to lines 55 and 56. The power splitter 52 is connected through matrix 22 to any pin of fixture 50. Any reflected wave which occurs after the pulse reaches the open pin on the fixture through matrix 22 is transferred by the power splitter from line 56 to line 55 and becomes an input to test unit 12. Test unit 12 through channel 16 actuates controller 18 to select the next pin in some predetermined sequence. Controller 18 issues the required switching signals to matrix 22 through channel 20. All of the pins on fixture 50 are selected one at a time and a pulse from pulse generator 32 is applied to each pin of fixture 50. Test unit 12 compares the pulse it receives on line 55 with the reflected wave from the pin which also appears on line 55 to determine the time delay therebetween. The time delay (td) is actually measured from an arbitrary reference point fixed with respect to the start of the pulse to the start of the reflected wave. The test unit stores the time delays for each of the pins 178 associated with a designation of the particular pin.

Shorting device 298 is inserted into fixture 50. Test unit 12 through channel 60 informs controller 18 to issue the proper switching signals to matrix 22 for connecting line 56 to the preselected pin 171 and the waveform output 62 to the predetermined pin 172. The shorting device 298 connects the preselected pin 171 and the predetermined pin 172. Waveform output 62 is connected through line 64 to test unit 12. When the test unit 12 actuates pulse generator 32 and the shaped pulse is applied to lines 55 and 56 from power splitter 52, test unit 12 compares the pulse to the waveform it receives on line 64 from the predetermined pin the determine the time delay therebetween. The time delay associated with the waveform from the pulse recieved on line 55 and the output waveform received on line 64 is utilized by test unit 12 to compensate for the time delay present within the apparatus 10. The time delays associated between the pulse and the reflected wave from each of the pins is utilized to deskew the pins with the preselected pin and predetermined pin being utilized as a reference point. For example, if pins 171 and 172 have time delays of (n) and (m), respectively, and another pin 173 has a time delay of $(n+\Delta n)$ associated therewith, the test unit would utilize the $\Delta n$ to deskew the apparatus when pin 173 is utilized as an input. Pin 173 also has a time delay determined as $(m+\Delta m)$ to deskew the apparatus when pin 173 is utilized as an output. In the example after the shorting device 298 is inserted, the time delay between the pulse present on line 55 applied to the preselected pin 171 and the receipt of the output waveform on line 64 from the predetermined pin 172 is (a reference delay (k). The test unit 12 would compensate by utilizing the constant (k) to compensate for the time delay associated with line 64, output terminal 62 and the remaining portions of the path. Thus, the time delays of apparatus 10 are known and can be compensated for by the test unit 12. After CML circuit 14 is inserted onto fixture 50, a pin is selected as an input for application of the pulse, and a pin is selected as an output to test unit 12, the time delay for the circuit 14 for that particular function is determined by compensating for the time delay $(\Delta n)$ of the pin utilized as the input and the time delay $(\Delta m)$ of the pin utilized as the output and the constant (k). With the time delays of the apparatus 10 known, test unit 12 can thus compensate therefor in determining the characteristics of CML circuit 14.

Whereas the present invention has been described in relation to the particular drawings attached hereto, it should be understood that other and further modifications, apart from those shown or suggested herein, may be made within the spirit and scope of this invention.

What is claimed is:

1. Apparatus for calibrating CML integrated circuit test unit comprising:
   a. fixture capable of receiving a CML integrated circuit therein and including a plurality of pins, each pin capable of contact with one pad of said circuit when said circuit is mounted on said fixture;
   b. a pulse generator producing a shaped pulse upon actuation;
   c. a power splitter connected to receive said shaped pulse for transferring said shaped pulse to outputs thereof;

d. a matrix of electrically actuated relays connected to one output of said power splitter and to each pin of said fixture, said matrix adapted to connect said shaped pulse to a preselected pin; said matrix adapted to connect a predetermined pin to a waveform output of said matrix;
   e. a controller connected to said relays for providing a switching signal to each relay of said matrix, said test unit connected to another output of said power splitter and waveforms from said waveform output; and
   f. a shorting device selectively connectable between said predetermined pin and said preselected pin.

2. Apparatus for calibrating a test unit which characterizes a CML integrated circuit having a plurality of pads, comprising:
   a. a pulse generator producing a pulse of known shape;
   b. a power splitter receiving said pulse for transfer to outputs thereof;
   c. a fixture adapted to receive said circuit for providing contact through a pin thereof with each pad of said circuit;
   d. a matrix of electrically actuated relays connected to one output of said power splitter and to each pin of said fixture, said matrix capable of transferring said pulse to a preselected pin of said fixture and connecting a predetermined pin adjacent to said preselected pin to said test unit;
   e. a shorting device selectively connectable between said preselected pin and said predetermined pin; and
   f. said test unit connected to another output of said power splitter for determining time delay between said pulse and any reflected wave from said preselected pin and said predetermined pin without said shorting device connected and time delay between said pulse and a waveform from said matrix when said shorting device is connected.

3. Apparatus for calibrating a test unit capable of characterizing a CML circuit, said circuit having a plurality of pads, comprising:
   a. a pulse generator producing a pulse of a known shape when actuated by said test unit;
   b. a power splitter connected to receive said pulse, said power splitter transferring said pulse to two outputs thereof, one output of said power splitter connected to said test unit;
   c. a fixture adapted to receive said circuit and having a plurality of pins, each pin being disposed to contact one of said pads when said circuit is received into said fixture;
   d. a matrix of electrically actuated relays connected intermediate another output of the said power splitter and said pins, said matrix connection said pulse to a preselected pin of said fixture, said matrix connecting a predetermined pin to said test unit;
   e. shorting device selectively movable into contact with said preselected pin and said predetermined pin to provide approximately zero time delay therebetween; said test unit determining time delay between said pulse and any reflected wave from each pin of said pins when said shorting device is without contact with said preselected pin and said predetermined pin, and between said pulse and waveform transferred from said predetermined pin when said shorting device is in contact with said preselected pin and said predetermined pin.

4. Apparatus for calibrating a test unit utilized to characterize a CML integrated circuit comprising:
   a. a fixture having a plurality of pins capable of receiving said circuit;
   b. a pulse generator producing a pulse of known shape;
   c. a power splitter receiving said pulse for transferring said pulse to two outputs thereof, one output of said power splitter connected to said test unit;
   d. a matrix of electrically actuated relays located intermediate another output of said splitter and each pin of said fixture, said matrix capable of connecting said pulse to each pin in a sequence, said test unit determining the time delay between said pulse and a reflected wave transferred through said matrix and said power splitter from each pin for comparison of the time delay for a preselected pin with other pins.

5. Calibration apparatus comprising:
   a. a fixture means having a plurality of pins for receiving a CML circuit under test;
   b. a pulse means generating a pulse of known shape;
   c. a splitter means receiving said pulse for transferring said pulse to two outputs thereof and a reflected wave from one output to another output;
   d. a first matrix means connected to said one output of said power splitter means for applying said pulse to a preselected pin of said fixture;
   e. a second matrix means connecting a predetermined pin of said fixture means to a waveform output;
   f. a shorting means selectively connectable between said preselected pin and said predetermined pin to provide a short circuit therebetween when connected;
   g. a first test means connected to said another output of said power splitter for determining time delay between said pulse and a reflected wave without said shorting means connected for each pin; and
   h. a second test means connected to said another output of said power splitter and to said waveform output for determining time delay between said pulse and waveform received from said predetermined pin when said shorting means is connected.

6. Calibration apparatus comprising:
   a. a fixture means having a plurality of pins and capable of receiving a CML circuit under test;
   b. a pulse means generating a pulse of known shape;
   c. a splitter means receiving said pulse for transferring said pulse to two outputs thereof;
   d. a matrix means connected intermediate one output of said power splitter and each pin of said fixture for applying said pulse to each pin including a preselected pin and a predetermined pin in a known sequence; and
   e. a test means connected to another output of said power splitter to determine the time delay between said pulse and a reflected wave from each pin as selected including said preselected pin for comparing time delays for all pins with the time delay for said preselected pin and said predetermined pin.

7. Method for calibrating a test unit comprising the steps of:
   a. generating a pulse of known shape;
   b. applying said pulse to said test unit and to a preselected pin of a fixture, said fixture capable of receiving a CML integrated circuit;
   c. determining time delay (n) between said pulse and a reflected wave by said test unit;

d. applying said pulse to said test unit and to a predetermined pin of said fixture;
e. determining time delay (m) between said pulse and a reflected wave by said test unit;
f. shorting said preselected pin and a predetermined pin of said fixture;
g. connecting said predetermined pin to said test unit; and
h. determining time delay (k) between said pulse and waveform from said predetermined pin by said test unit.

8. Method for calibrating a test unit comprising the steps of:
a. generating a pulse of known shape;
b. applying said pulse to said test unit and to each pin of a fixture, said fixture having a plurality of pins for receiving a CML integrated circuit thereinto, one pin of said fixture being a preselected pin and another pin being a predetermined pin;
c. determining time delay between said pulse and a reflected wave by said test unit;
d. repeating steps a, b, and c for all pins including said preselected pin (n) and said predetermined pin (m); and
e. comparing time delay (n+Δn) (m+Δm) determined for each pin excluding said preselected pin with time delay (n) for said preselected pin and time delay (m) for said predetermined pin by said test unit;
f. shorting said preselected and predetermined pins;
g. connecting said predetermined pin to said test unit; and
h. determining time delay (k) between said pulse applied to said preselected pin and a waveform from said predetermined pin by said test unit.

* * * * *